United States Patent
Murakami et al.

(10) Patent No.: US 9,735,017 B2
(45) Date of Patent: Aug. 15, 2017

(54) METHOD OF MANUFACTURING SEMICONDUCTOR DEVICE

(71) Applicant: RENESAS ELECTRONICS CORPORATION, Kanagawa (JP)

(72) Inventors: Yoshinori Murakami, Kanagawa (JP); Hitoshi Fukuma, Kanagawa (JP); Taku Kanaoka, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/597,487

(22) Filed: Jan. 15, 2015

(65) Prior Publication Data

US 2015/0206767 A1    Jul. 23, 2015

(30) Foreign Application Priority Data

Jan. 21, 2014 (JP) ................................. 2014-009004

(51) Int. Cl.
*H01L 21/288* (2006.01)
*C25D 3/48* (2006.01)
(Continued)

(52) U.S. Cl.
CPC .............. *H01L 21/288* (2013.01); *C25D 3/48* (2013.01); *C25D 5/10* (2013.01); *C25D 5/18* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 4,869,971 A * | 9/1989 | Nee | ........................... | C25D 5/10 205/104 |
| 6,583,446 B1 * | 6/2003 | Taninaka | .............. | H01L 27/153 257/93 |
| 6,759,703 B1 * | 7/2004 | Matsuhashi | ............. | H01L 28/75 257/306 |
| 7,226,856 B1 * | 6/2007 | Lopatin | ............. | H01L 21/76843 438/629 |
| 8,026,163 B2 | 9/2011 | Kanaoka et al. | | |
| 8,029,660 B2 | 10/2011 | Maitani et al. | | |
| 2003/0075451 A1 * | 4/2003 | Kanda | ................. | H01L 21/2885 205/157 |
| 2004/0166661 A1 * | 8/2004 | Lei | ........................... | H01L 24/03 438/614 |
| 2006/0086616 A1 * | 4/2006 | Kurashina | ................. | C25D 5/22 205/83 |
| 2006/0118952 A1 * | 6/2006 | Suzuki | ...................... | C25D 3/48 257/737 |
| 2009/0114874 A1 * | 5/2009 | Norman | ................. | C07F 7/1844 252/62.3 E |
| 2010/0190029 A1 * | 7/2010 | Ueki | ........................ | B32B 15/08 428/687 |

(Continued)

FOREIGN PATENT DOCUMENTS

JP    06188267 A  *  7/1994    ............. H01L 21/44
JP    7-197299 A      8/1995
(Continued)

OTHER PUBLICATIONS

Japanese Office Action received in corresponding Japanese Application No. 2014-009004 dated Jun. 20, 2017.

*Primary Examiner* — Johannes P Mondt
(74) *Attorney, Agent, or Firm* — Mattingly & Malur, PC

(57) ABSTRACT

A false report on appearance inspection of a semiconductor device is prevented by suppressing variation in surface state of an electrodeposited gold electrode. In formation of an electrodeposited gold electrode, an electrodeposited gold electrode comprised of a plurality of electrodeposited gold layers in the stack is formed by alternately repeating a step of performing energization between an anode electrode and a cathode electrode provided in a treatment cup of a plating apparatus to cause crystal growth of an electrodeposited gold layer (energization ON), and a step of performing no energization between the anode electrode and the cathode electrode (energization OFF). Consequently, even if aging variation occurs in composition of the plating solution, variation in surface state of the electrodeposited gold electrode is suppressed, and a surface state with a surface roughness of, for example, about 0.025 rad can be maintained.

13 Claims, 13 Drawing Sheets

(51) Int. Cl.
*C25D 7/12* (2006.01)
*C25D 5/10* (2006.01)
*C25D 5/18* (2006.01)
*C25D 17/00* (2006.01)
*H01L 23/00* (2006.01)
*C25D 5/16* (2006.01)
*C25D 21/10* (2006.01)

(52) U.S. Cl.
CPC ........... *C25D 7/123* (2013.01); *C25D 17/001* (2013.01); *H01L 24/11* (2013.01); *H01L 24/742* (2013.01); *C25D 5/16* (2013.01); *C25D 21/10* (2013.01); *H01L 24/13* (2013.01); *H01L 2224/0345* (2013.01); *H01L 2224/0401* (2013.01); *H01L 2224/05022* (2013.01); *H01L 2224/05124* (2013.01); *H01L 2224/05147* (2013.01); *H01L 2224/05166* (2013.01); *H01L 2224/05572* (2013.01); *H01L 2224/05582* (2013.01); *H01L 2224/05664* (2013.01); *H01L 2224/1147* (2013.01); *H01L 2224/11462* (2013.01); *H01L 2224/13022* (2013.01); *H01L 2224/13144* (2013.01)

(56) References Cited

U.S. PATENT DOCUMENTS

2012/0225197 A1* 9/2012 Ebigase .................. H01L 41/29
427/77
2013/0112564 A1* 5/2013 Kleiman-Shwarsctein C25D 3/56
205/104

FOREIGN PATENT DOCUMENTS

JP 2009-114476 A 5/2009
JP 2011-105968 A 6/2011

* cited by examiner

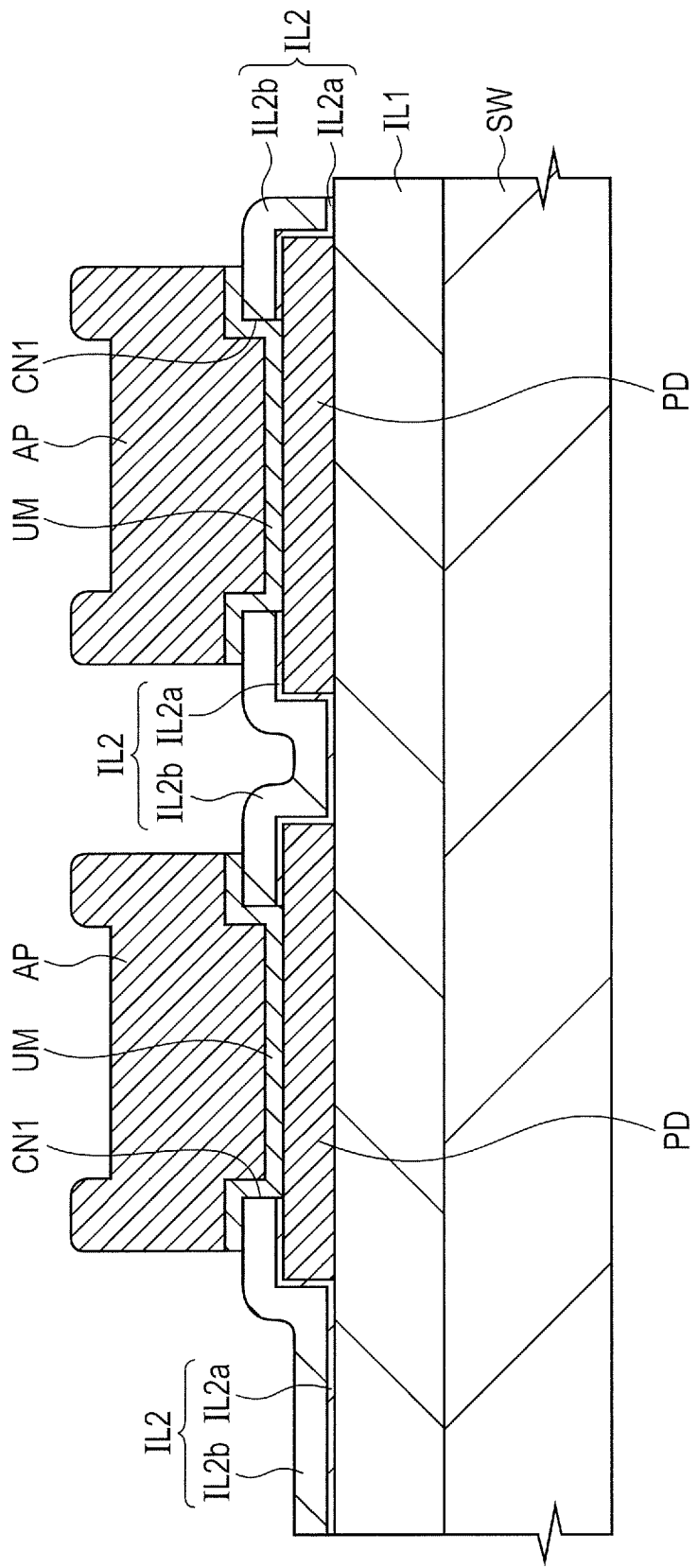

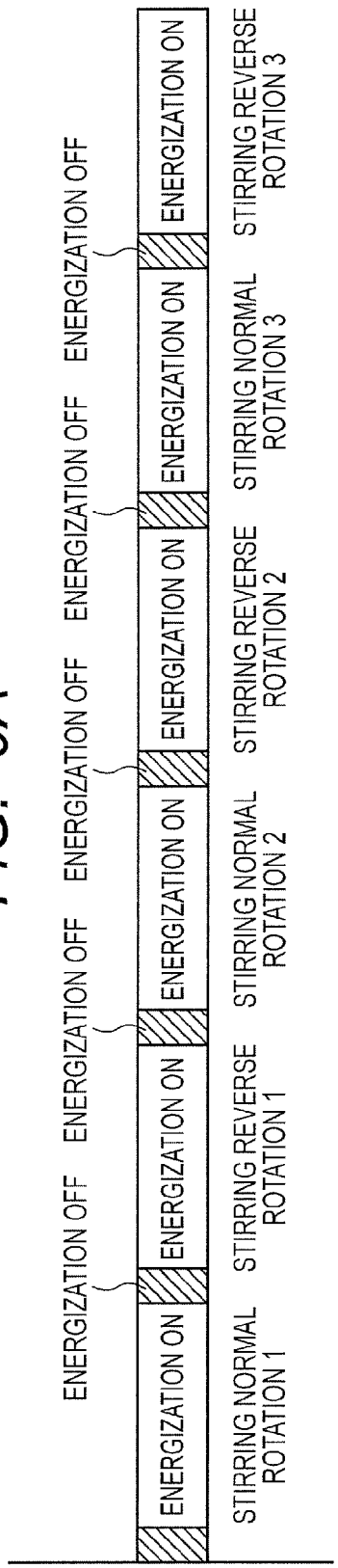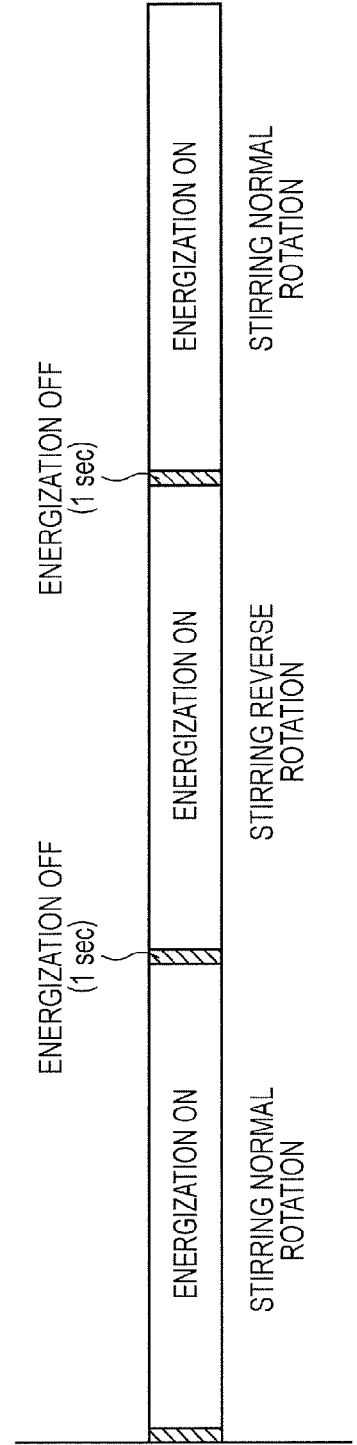

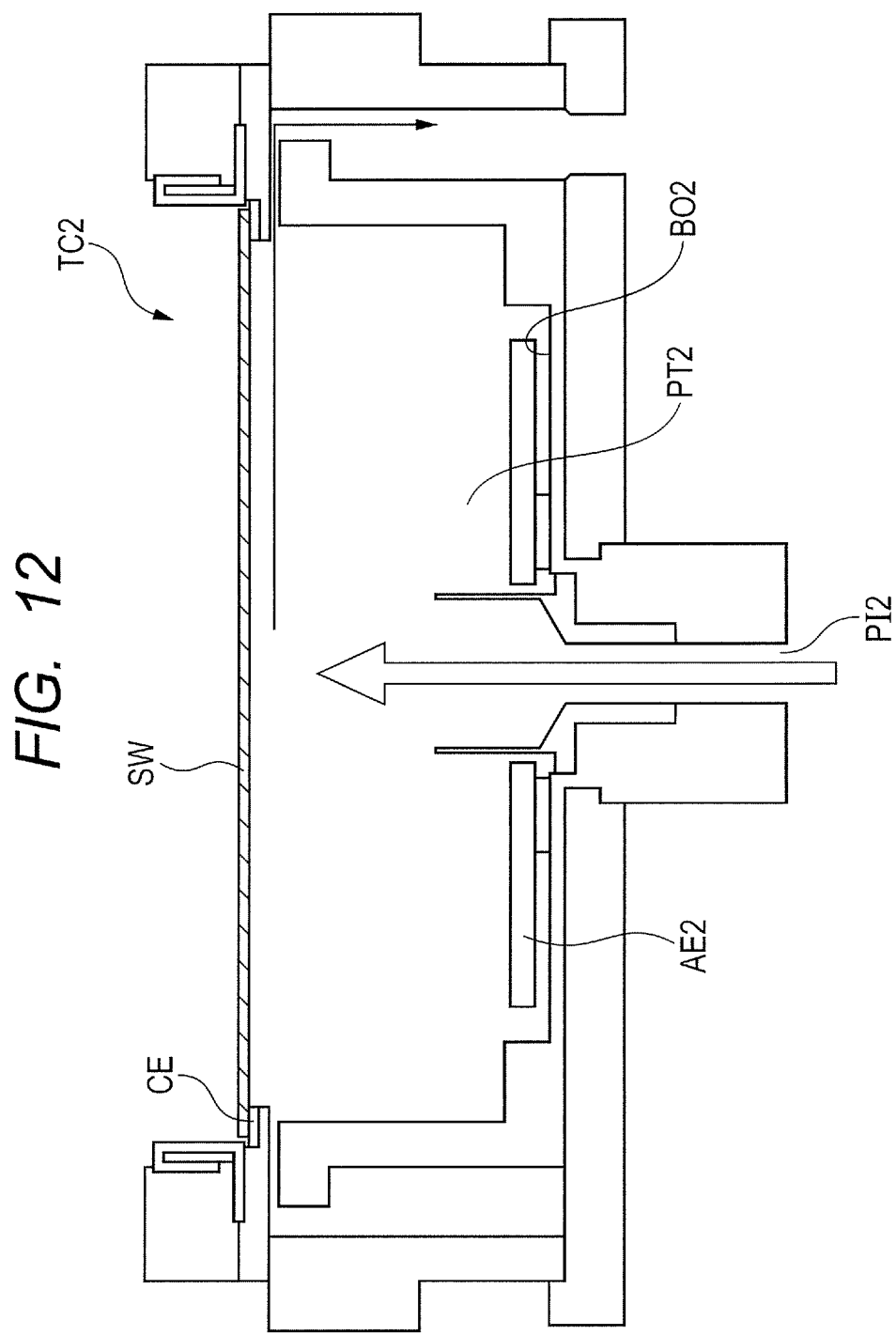

METHOD OF MANUFACTURING SEMICONDUCTOR DEVICE

CROSS-REFERENCE TO RELATED APPLICATIONS

The disclosure of Japanese Patent Application No. 2014-009004 filed on Jan. 21, 2014 including the specification, drawings and abstract is incorporated herein by reference in its entirety.

BACKGROUND

The present invention relates to a technique for manufacturing a semiconductor device, the technique being preferably used for, for example, a manufacturing process of a semiconductor device having an electrodeposited electrode formed by an electrolytic plating process.

Japanese Unexamined Patent Application Publication No. 2011-105968 describes a technique in which a voltage applied to a plating solution is monitored during a step of forming a gold bump electrode by an electrolytic gold plating technique using a non-cyanide plating solution, thereby the amount of thallium added to the plating solution is detected to suppress occurrence of inferior plating such as anomalous deposition due to decrease in concentration of added thallium.

SUMMARY

There have been a large number of reports on anomalous appearance, which is found in appearance inspection of a semiconductor device, of an electrode formed on a main surface of a semiconductor substrate by an electrolyte gold plating process (hereinafter referred to as electrodeposited gold electrode). However, most of such reports on anomalous appearance have been false reports in which gold precipitates are detected as foreign substances while they are essentially not necessary to be detected as foreign substances. Such false detection is caused by gradual change of a surface of the electrodeposited gold electrode from a rough state to a smooth state due to aging variation in composition of the plating solution. It has been therefore necessary to suppress variation in surface state of the electrodeposited gold electrode in order to decrease the false reports on appearance inspection of a semiconductor device.

Other issues and novel features will be clarified from the description of this specification and the accompanying drawings.

According to an embodiment of the present invention, there is provided a method of manufacturing a semiconductor device, in which when an electrodeposited gold electrode is formed by an electrolytic gold plating process, a step of performing energization between an anode electrode and a cathode electrode provided in a treatment cup of a plating apparatus to cause crystal growth of a electrodeposited gold layer, and a step of performing no energization between the anode electrode and the cathode electrode are alternately repeated, thereby an electrodeposited gold electrode comprised of a plurality of electrodeposited gold layers in the stack is formed.

According to the embodiment of the invention, since variation in surface state of the electrodeposited gold electrode can be suppressed, a false report on appearance inspection of a semiconductor device can be prevented.

BRIEF DESCRIPTION OF THE DRAWINGS

FIG. 6 is a major-part section diagram of the same portion as that of FIG. 1 during the manufacturing process following FIG. 5.

FIG. 7A is a major-part section diagram illustrating an aspect of the treatment cup of the first plating apparatus when a semiconductor wafer is set therein or removed therefrom, and FIG. 7B is a major-part section diagram illustrating an aspect of the treatment cup of the first plating apparatus when a semiconductor wafer is subjected to plating.

FIG. 9A is a schematic illustration of a recipe configuration in plating using the first plating apparatus according to this embodiment, and FIG. 9B is a schematic illustration of a recipe configuration in plating using the first plating apparatus in a comparative investigation by the inventors.

FIG. 12 is a major-part section diagram of a treatment cup provided in a second plating apparatus according to this embodiment, the treatment cup being structured to stir a plating solution with a jet.

DETAILED DESCRIPTION

Figure 1:
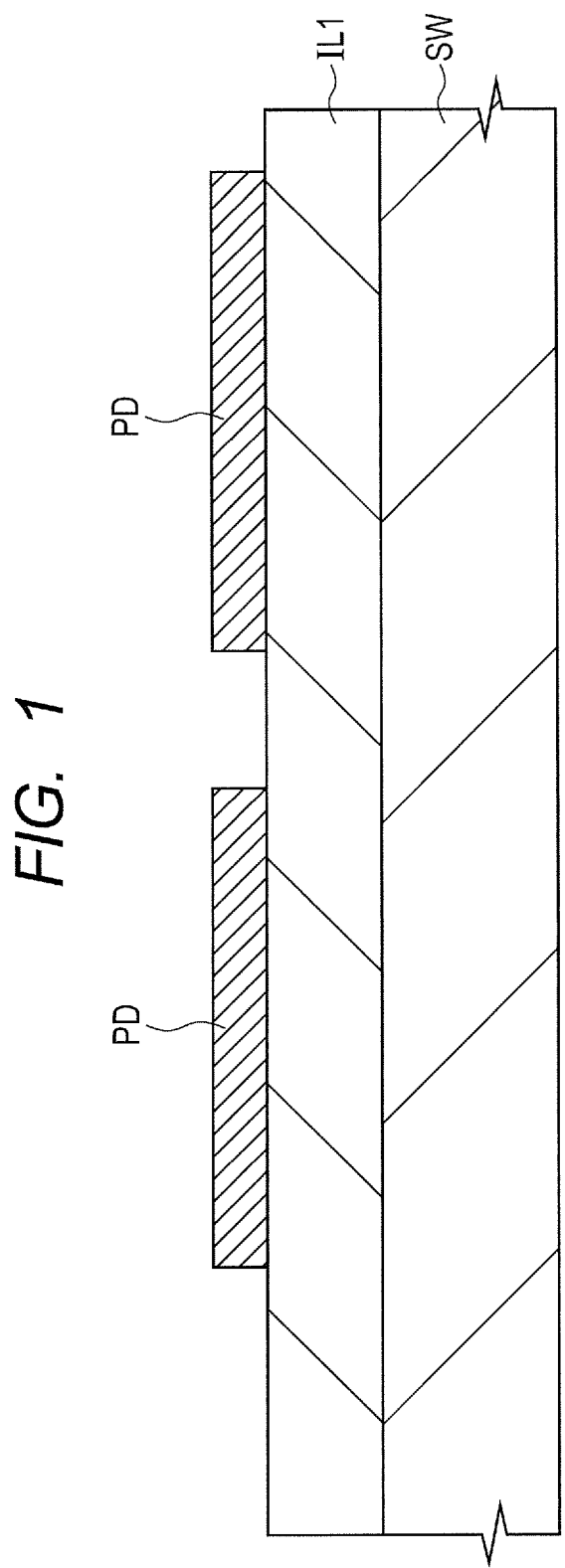
FIG. 1 is a major-part section diagram of a semiconductor device during a manufacturing process of an electrodeposited gold electrode according to an embodiment of the invention.

Although the following embodiment may be dividedly described in a plurality of sections or embodiments for convenience as necessary, they are not unrelated to one another except for the particularly defined case, and are in a relationship where one is a modification, a detail, supplementary explanation, or the like of part or all of another one.

In the following embodiment, when the number of elements and the like (including the number, a numerical value, amount, a range, etc.) are mentioned, the number is not limited to a specified number except for the particularly defined case, or the case where the number is principally clearly limited to the specified number. In other words, the number may be not less than or not more than the specified number.

In the following embodiment, it will be appreciated that a constitutional element (including an element step etc.) of the embodiment are not necessarily indispensable except for the particularly defined case and for the case where the constitutional element is considered to be principally clearly indispensable.

It will be appreciated that the term "comprised of A", "configured of A", "having A", or "including A" is not intended to exclude any element other than the element A except for the case where the element A is particularly defined to be exclusive, for example. Similarly, in the following embodiment, description on a shape of a constitutional element etc., a positional relationship, or the like is intended to include an element etc. having a shape or the like substantially similar to that of the constitutional element etc. except for the particularly defined case and for the case where such an element etc. is considered to be principally clearly not included. The same holds true in each of the numerical value and the range.

In drawings used in the following embodiment, a plan diagram may also be hatched for better viewability. In all drawings for explaining the following embodiment, components having the same function are in principle designated by the same numeral, and duplicated description is omitted. Hereinafter, an embodiment of the invention is described in detail according to the accompanying drawings.

The inventors have found issues in appearance inspection of a semiconductor device, and the issues are now specifically described since the method of manufacturing a semiconductor device according to the embodiment of the invention is considered to be further clarified thereby.

The inventors adopts an electrodeposited gold electrode that is formed on a pad electrode with a seed film therebetween by an electrolytic gold plating process, i.e., adopts an electrode having a so-called over pad metallization (OPM) structure, as an external electrode provided in the semiconductor device for electrical coupling to an external component. However, there has been reported anomalous appearance of the electrodeposited gold electrode, which is found in appearance inspection of a semiconductor device, while the reported anomalous appearance is essentially not anomalous appearance. The inventors therefore have made investigations on a cause of such false inspection and a measure against that.

In a step of forming the electrodeposited gold electrode, as the number of times of treatment or the lapse of time from initial make-up of electrolytic bath increases, aging variation occurs in composition of a plating solution, and thus a surface of the electrodeposited gold electrode is gradually changed from a rough state to a smooth state. In addition, visual brightness of the electrodeposited gold electrode varies depending on a surface state of the electrodeposited gold electrode. Specifically, an electrodeposited gold electrode having a rough surface (for example, surface roughness of 0.025 rad or more) shows dark appearance in appearance inspection, while an electrodeposited gold electrode having a smooth surface (for example, surface roughness of less than 0.025 rad) shows bright appearance in the appearance inspection.

Hence, in the step of forming the electrodeposited gold electrode, as the number of times of treatment or the lapse of time from initial make-up of electrolytic bath increases, appearance of the electrodeposited gold electrode is gradually changed from a dark state to a bright state.

In the step of forming the electrodeposited gold electrode, a gold projection having a size of 20 to 100 μm in diameter may be formed due to precipitation of gold. Even if such a gold projection is formed on the surface of the electrodeposited gold electrode, a trouble such as significant reduction in yield of a semiconductor device does not occur; hence, the gold projection may be formed. In appearance inspection, even if the gold projection exists on the electrodeposited gold electrode having a dark appearance (the electrodeposited gold electrode having a rough surface), the gold projection is not recognized and the electrodeposited gold electrode is determined to be normal in appearance.

However, if the gold projection exists on the electrodeposited gold electrode having a bright appearance (the electrodeposited gold electrode having a smooth surface), the gold projection is recognized as a foreign substance in appearance inspection, and thus the electrodeposited gold electrode is determined to be anomalous in appearance while being essentially normal.

Consequently, it has been understood that the surface of the electrodeposited gold electrode is necessary to be kept rough, for example, 0.025 rad or more, so that the gold projection is not recognized in appearance inspection, in order to decrease the false reports on appearance inspection of a semiconductor device. The surface of the electrodeposited gold electrode can be kept rough by controlling a concentration ratio of sulfurous acid to sulfuric acid contained in a plating solution. However, such a method requires replacement of the plating solution or addition of sulfurous acid, leading to increase in manufacturing cost.

First Embodiment

<Manufacturing Process of Electrodeposited Gold Electrode>

A method of manufacturing a semiconductor device according to a first embodiment is described in step order with FIGS. 1 to 6. FIGS. 1 to 6 are each a major-part section diagram of a semiconductor device for explaining a manufacturing process of the electrodeposited gold electrode.

First, as illustrated in FIG. 1, a semiconductor substrate, which is a semiconductor wafer SW processed into a thin circular sheet shape in this exemplary case, is prepared, and a plurality of semiconductor elements, multilayer-structured interconnections, and the like, which are each omitted to be shown, are formed on a main surface of the semiconductor wafer SW. Furthermore, a surface protection film IL1 covering the multilayer-structured interconnections and the like is formed, and then pad electrodes PD including, for example, aluminum as a main conductor are formed, each pad electrode PD being to be electrically coupled to, for example, a top interconnection of the multilayer-structured interconnections. The pad electrode PD is formed by forming an aluminum film on the main surface of the semiconductor wafer SW by, for example, a sputtering process, and then processing the aluminum film by a photolithography process and a dry etching process. The pad electrode PD has a thickness of about 1 μm, for example. Although the pad electrode PD includes aluminum as the main conductor in the first embodiment, the pad electrode PD may include copper as the main conductor.

Figure 2:
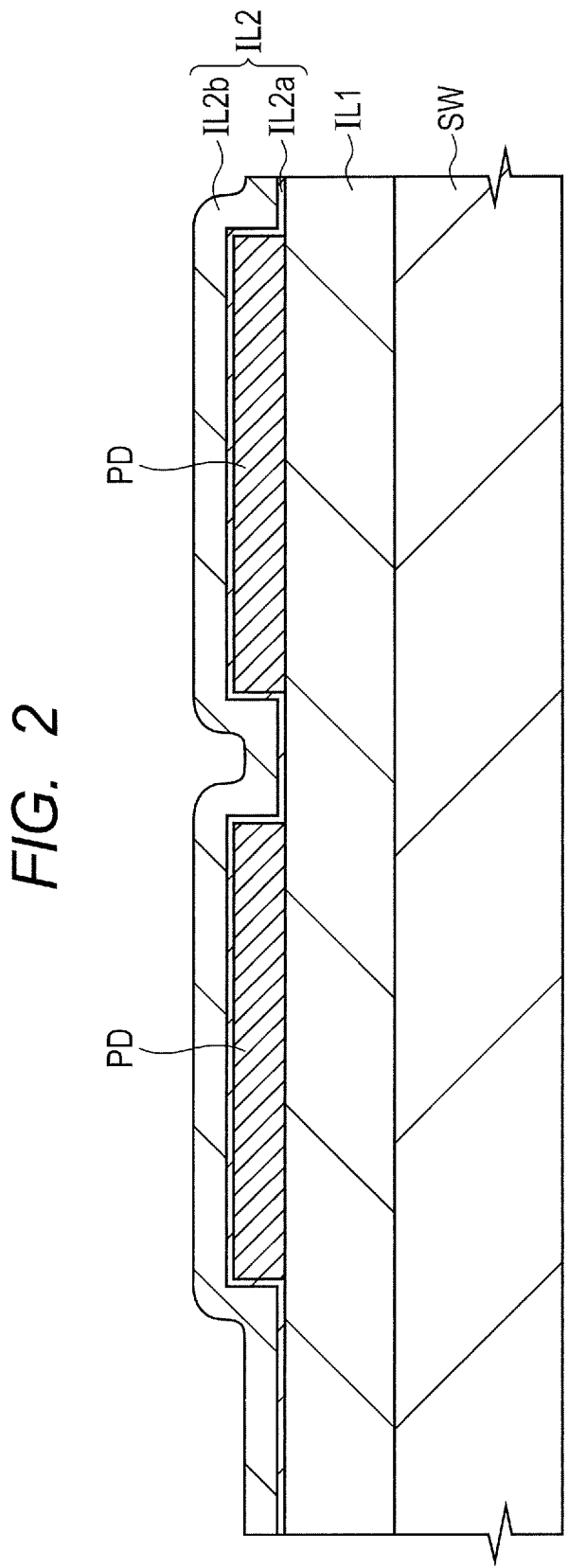
FIG. 2 is a major-part section diagram of the same portion as that of FIG. 1 during the manufacturing process following FIG. 1.

Subsequently, as illustrated in FIG. 2, a silicon oxide film IL2a is formed on the main surface of the semiconductor wafer SW by, for example, a plasma chemical vapor deposition (CVD) process so as to cover the pad electrodes PD. Subsequently, a silicon nitride film IL2b is formed on the silicon oxide film IL2a by, for example, a plasma CVD process, so that a passivation film IL2 comprised of the silicon oxide film IL2a and the silicon nitride film IL2b is formed. The passivation film IL2 has a function of preventing entering of water or impurities from outside, and a function of suppressing transmission of α rays. The silicon oxide film IL2a has a thickness of, for example, 0.2 μm, and the silicon nitride film IL2b has a thickness of, for example, 0.6 μm.

Figure 3:
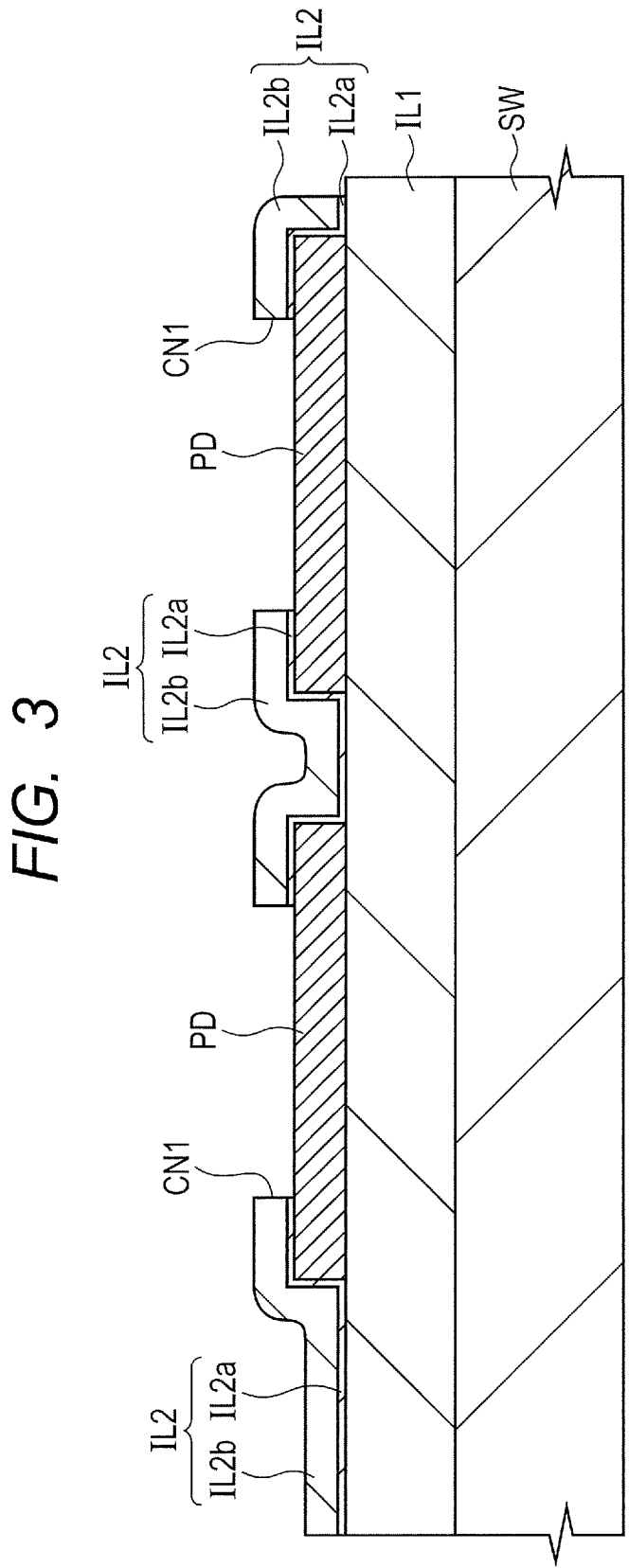
FIG. 3 is a major-part section diagram of the same portion as that of FIG. 1 during the manufacturing process following FIG. 2.

Subsequently, as illustrated in FIG. 3, the passivation film IL2 is processed by a photolithography process and a dry etching process, thereby pad openings CN1, which each allows a portion of the pad electrode PD other than a periphery thereof to be exposed, are formed in the passivation film IL2.

Figure 4:
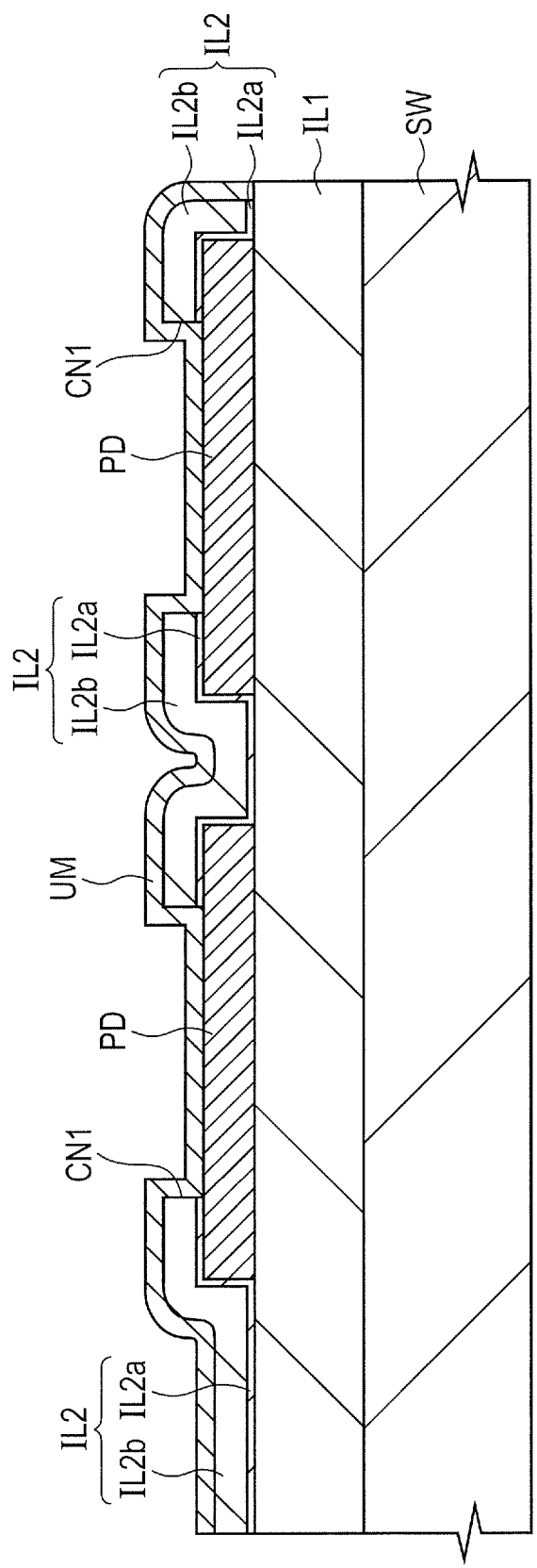
FIG. 4 is a major-part section diagram of the same portion as that of FIG. 1 during the manufacturing process following FIG. 3.

Subsequently, as illustrated in FIG. 4, a titanium film and a palladium film are sequentially formed on the main surface of the semiconductor wafer SW by, for example, a sputtering process, so that a seed film (base film) UM comprised of the titanium film and the palladium film is formed. The titanium film is provided to prevent diffusion of palladium to a semiconductor wafer SW side, and the palladium film is provided to promote growth of the electrodeposited gold electrode formed in a later step. The titanium film has a thickness of, for example, about 0.175 μm, and the palladium film has a thickness of, for example, about 0.175 μm.

Figure 5:
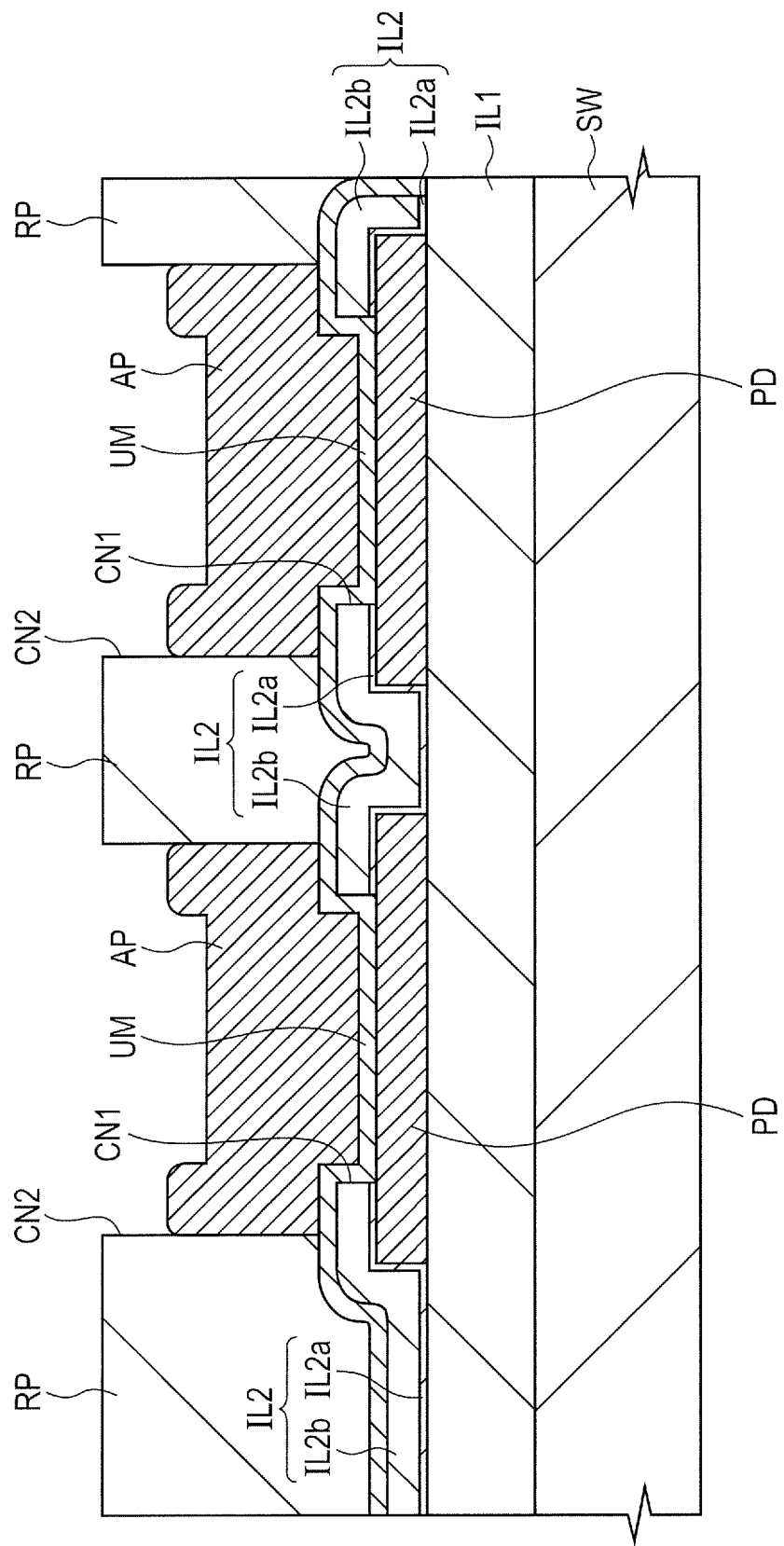
FIG. 5 is a major-part section diagram of the same portion as that of FIG. 1 during the manufacturing process following FIG. 4.

Subsequently, as illustrated in FIG. 5, a resist pattern RP is formed on the seed film UM by a photolithography process. The resist pattern RP has an opening CN2 on each pad electrode PD in a plan view, and the seed film UM is exposed at a bottom of the opening CN2. A planar size of the opening CN2 is smaller than a planar size of the pad electrode PD and larger than planar size of the opening CN1. The resist pattern RP has a thickness of, for example, about 10 μm.

Subsequently, the electrodeposited gold electrode AP is formed in the inside of the opening CN2 of the resist pattern RP by an electrolytic gold plating process. The electrodeposited gold electrode AP has a thickness of, for example, about 3 μm. The electrodeposited gold electrode AP has a surface roughness of, for example, 0.025 rad or more. A formation method of the electrodeposited gold electrode AP by the electrolytic gold plating process is described in detail later.

Subsequently, as illustrated in FIG. 6, the resist pattern RP is removed. Subsequently, the unnecessary (exposed) seed film UM is removed by a wet etching process with the electrodeposited gold electrode AP as a mask. Through the above steps, the electrodeposited gold electrode AP, which is electrically coupled to the pad electrode PD with the seed film UM therebetween, is substantially completed.

<Formation Method of Electrodeposited Gold Electrode Using First Plating Apparatus>

A formation method of an electrodeposited gold electrode (the electrodeposited gold electrode AP illustrated in FIG. 5) using a first plating apparatus according to the first embodiment is now described. The first plating apparatus has a treatment cup that is structured to stir a plating solution with a stirrer.

Figures 7A, 7B:
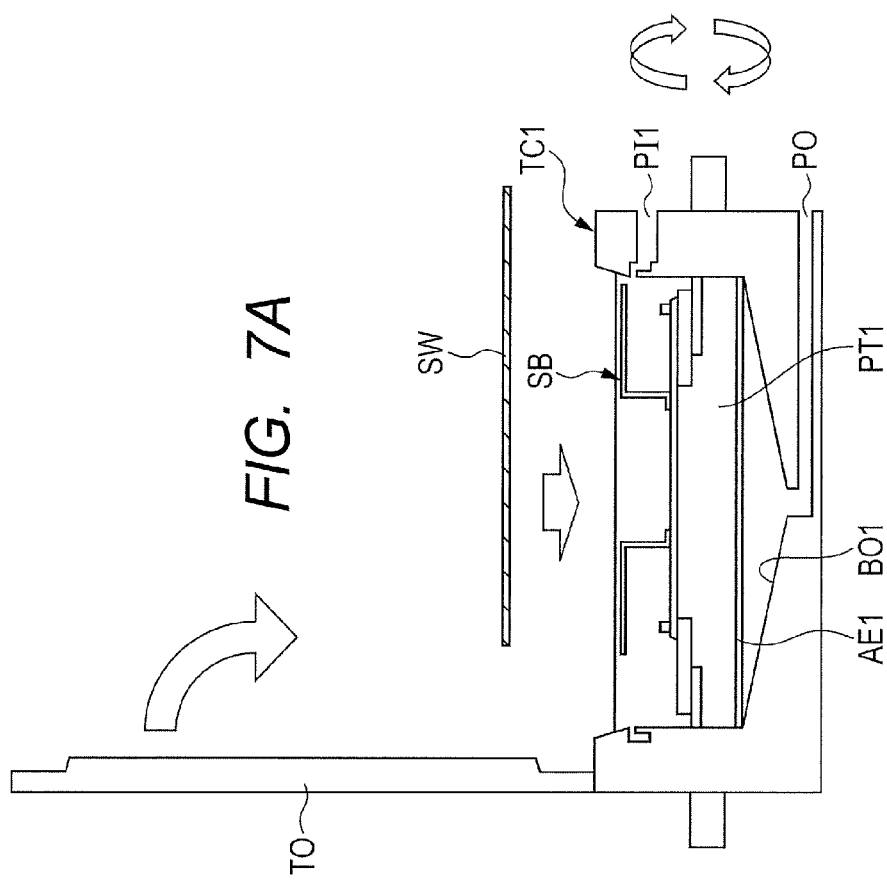
FIGS. 7A and 7B are each a major-part section diagram of a treatment cup provided in a first plating apparatus according to this embodiment, the treatment cup being structured to stir a plating solution with a stirrer.

1. Internal Structure of Treatment Cup of First Plating Apparatus:

An internal structure of the treatment cup of the first plating apparatus is now described with FIGS. 7A and 7B. FIGS. 7A and 7B are each a major-part section diagram of the treatment cup of the first plating apparatus, where FIG. 7A is a major-part section diagram illustrating an aspect of the treatment cup of the first plating apparatus when a semiconductor wafer is set therein or removed therefrom, and FIG. 7B is a major-part section diagram illustrating an aspect of the treatment cup of the first plating apparatus when a semiconductor wafer is subjected to plating.

The treatment cup of the first plating apparatus has a bottom and a sidewall, and is defined to be in an erected state where the bottom lies below, while being defined to be in an inverted state where the bottom lies above. Specifically, since the treatment cup is vertically turned 180 degrees, top and bottom are defined with reference to the erected state of the treatment cup regardless of whether the vertical turnover occurs or not. While a plating bath exists in the inside of the treatment cup, a lower side of the plating bath refers to a bottom side of the plating bath, and an upper side of the plating bath refers to an opened-face side thereof, the opened face being opposed to the bottom of the plating bath and to be covered by a lid.

As illustrated in FIG. 7A, the plating bath PT1 exists in the inside of the treatment cup TC1. The plating bath PT1 has a bottom BO1 and a side face, and is opened on its side opposed to the bottom BO1. The treatment cup TC1 has a lid TO that is configured to cover the opened face of the plating bath PT1.

The semiconductor wafer SW is set on the upper side of the plating bath PT1 while a device forming surface (pattern surface, or main surface) is allowed to face the inside of the plating bath PT1. A stirrer SB for stirring a plating solution is provided in the center of the plating bath PT1. The stirrer SB is controlled so as to be rotated within the plating bath PT1.

An anode electrode AE1 is provided between the center and the bottom BO1 of the plating bath PT1. The anode electrode AE1 is an indium oxide electrode or a platinum electrode, for example. An undepicted cathode electrode for electrical coupling to the semiconductor wafer SW is provided in the upper side of the side face of the plating bath PT1.

A liquid outlet PO for discharging the plating solution is provided in the bottom BO1 of the plating bath PT1. A liquid inlet PI1 for introducing the plating solution is provided in the side face on a side upper than the center of the plating bath PT1.

The treatment cup TC1 of the first plating apparatus has a vertical turnover mechanism. Specifically, when the semiconductor wafer SW is set in the treatment cup TC1, or when the semiconductor wafer SW is extracted from the treatment cup TC1, as illustrated in FIG. 7A, the device forming surface of the semiconductor wafer SW faces down (facedown). On the other hand, when the semiconductor wafer SW is subjected to plating, as illustrated in FIG. 7B, the treatment cup TC1 is vertically turned over, and the device forming surface of the semiconductor wafer SW faces up (face-up).

Figure 8:
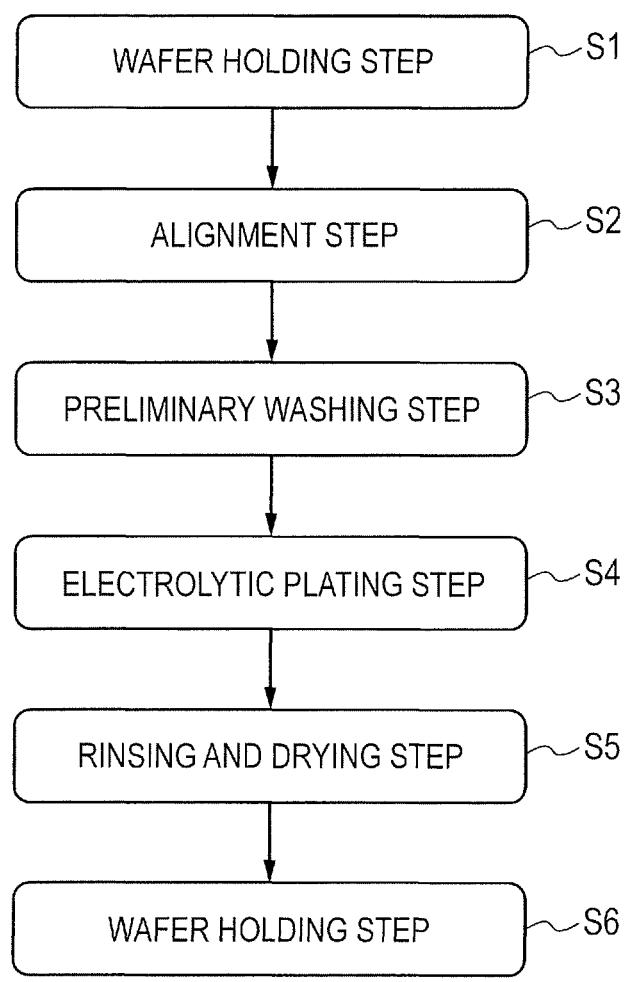
FIG. 8 is a process flowchart of a plating process using the first plating apparatus according to this embodiment.

2. Steps of Plating Process:

Steps of a plating process are now described with FIG. 8. FIG. 8 is a process flowchart of a plating process using the first plating apparatus.

<Wafer Holding Step (Step S1 of FIG. 8)>

A plurality of semiconductor wafers are held in a wafer holder, so-called Foup, and the wafer holder is set in a load port provided in the first plating apparatus.

<Alignment Step (Step S2 of FIG. 8)>

A semiconductor wafer on standby in the Foup is extracted and transferred to a wafer alignment section by a transfer robot, and alignment of the semiconductor wafer is performed in the wafer alignment section.

<Preliminary Washing Step (Step S3 of FIG. 8)>

The semiconductor wafer is transferred from the wafer alignment section to a washing section by the transfer robot, and is washed by pure water in the washing section.

<Electrolytic Plating Step (Step S4 of FIG. 8)>

The semiconductor wafer is transferred from the washing section into the treatment cup of a plating section by the transfer robot, and is subjected to electrolytic plating in the treatment cup.

<Rinsing and Drying Step (Step S5 of FIG. 8)>

The semiconductor wafer is transferred from the treatment cup of the plating section to a rinsing and drying section by the transfer robot, and is rinsed with pure water and spin-dried in the rinsing and drying section.

<Wafer Holding Step (Step S6 of FIG. 8)>

The semiconductor wafer is transferred from the rinsing and drying section to the former wafer holder or another wafer holder as necessary by the transfer robot, and is held therein.

Figure 10A:
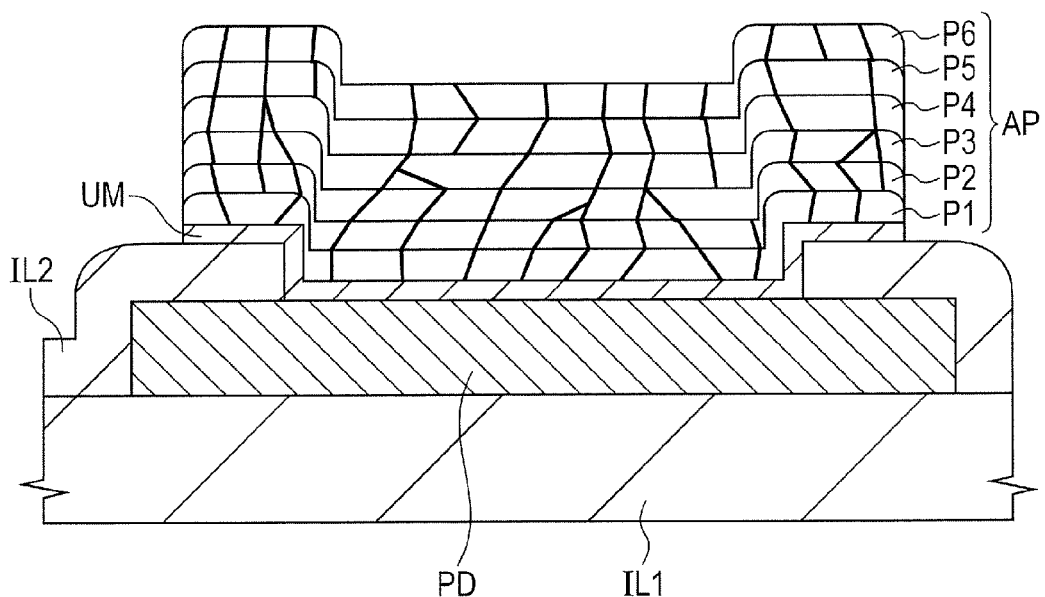
FIG. 10A is a section diagram schematically showing an electrodeposited gold electrode according to this embodiment.
Figure 10B:
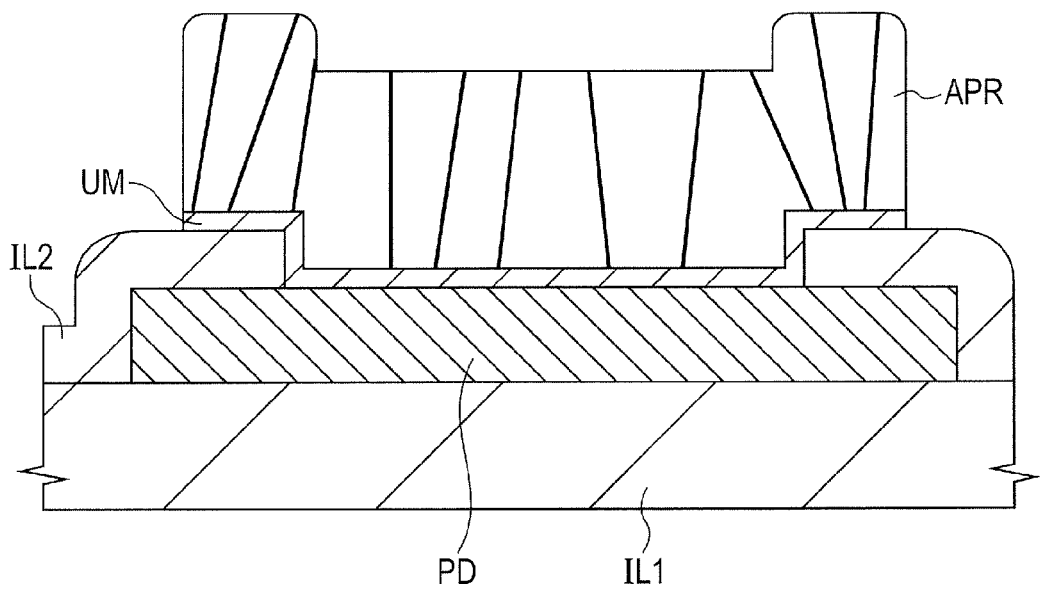
FIG. 10B is a section diagram schematically showing an electrodeposited gold electrode in a comparative investigation by the inventors.
Figure 11:
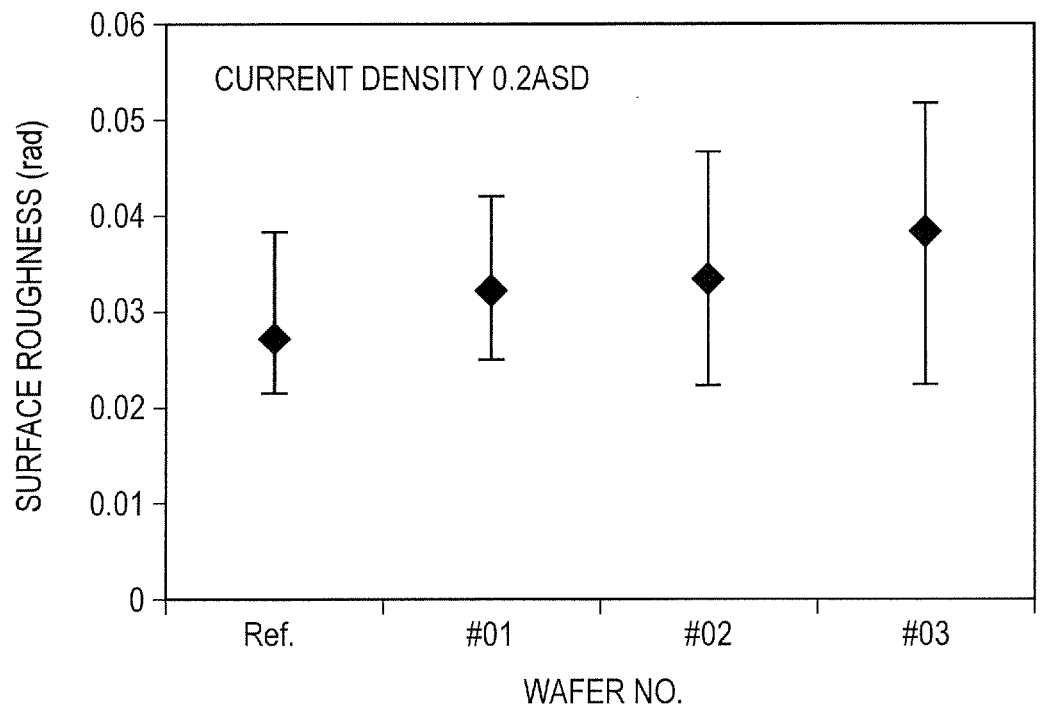
FIG. 11 includes a graph showing surface roughness of an electrodeposited gold electrode according to this embodiment with each of energization ON time and energization OFF time as a parameter, and a table collectively showing the energization ON time and the energization OFF time for each semiconductor wafer.

3. Formation Method of Electrodeposited Gold Electrode by Electrolytic Gold Plating Process:

A formation method of the electrodeposited gold electrode by the electrolytic gold plating process (an electrolytic plating step (step S4 of FIG. 8)) is now described with FIGS. 7A and 7B, FIGS. 9A and 9B, FIGS. 10A and 10B, and FIG. 11. FIG. 9A is a schematic illustration of a recipe configuration in plating using the first plating apparatus. FIG. 9B is a schematic illustration of a recipe configuration in plating using the first plating apparatus in a comparative investigation by the inventors. FIG. 10A is a section diagram schematically illustrating the electrodeposited gold electrode. FIG. 10B is a section diagram schematically illustrating an electrodeposited gold electrode in a comparative investigation by the inventors. FIG. 11 includes a graph showing surface roughness of an electrodeposited gold electrode with each of energization ON time or energization OFF time as a parameter.

<Operation 1 of Electrolytic Plating Step>

As illustrated in FIG. 7A, the semiconductor wafer SW washed with pure water is transferred into the plating bath PT1 of the treatment cup TC1, and the semiconductor wafer SW is set on the upper side of the plating bath PT1 while the device forming surface is allowed to face the inside of the plating bath PT1. The semiconductor wafer SW is set while being in the erected state where the bottom of the treatment cup TC1 lies below. Subsequently, the lid TO provided for the treatment cup TC1 is closed to cover the opened face of the plating bath PT1.

<Operation 2 of Electrolytic Plating Step>

The plating solution is supplied through the liquid inlet PI1 provided on the upper side of the treatment cup TC1 (in the side face on a side upper than the center of the plating bath PT1), so that the inside of the plating bath PT1 is filled with the plating solution. The plating solution is a non-cyanide plating solution, and is, for example, a gold sulfite plating solution (including, as a main component, an aqueous solution of sodium gold sulfite, ethylene diamine, inorganic acid salts, and other trace additives). The temperature of the plating solution is, for example, about 40° C., and the supply flow rate of the plating solution is, for example, about 5 litter/min.

<Operation 3 of Electrolytic Plating Step>

As illustrated in FIG. 7B, the treatment cup TC1 is vertically turned 180 degrees so as to be into the inverted state. As a result, the bottom of the treatment cup TC1 lies above, and the lid TO covering the opened face of the plating bath PT1 lies below, and thus the device forming surface of the semiconductor wafer SW faces up. In this operation, energization for electrolytic plating is not performed, i.e., no current is allowed to flow between the anode electrode AE1 and the cathode electrode.

<Operation 4 of Electrolytic Plating Step>

Subsequently, as illustrated in FIG. 9A, the stirrer is normally rotated (counterclockwise rotated) to stir the plating solution (stirring normal rotation 1). At this time, a predetermined current is continuously allowed to flow between the anode electrode and the cathode electrode (energization ON). The rotation speed of the stirrer is, for example, about 90 rpm, and the energization ON time is, for example, about 20 to 60 sec. This continuous energization allows isotropic crystal growth of gold on the seed film, resulting in formation of an electrodeposited gold layer.

Subsequently, the normal rotation (counterclockwise rotation) of the stirrer is stopped to switch the stirring direction of the stirrer from the normal rotation (counterclockwise rotation) to reverse rotation (clockwise rotation). At this time, no current is allowed to flow between the anode electrode and the cathode electrode (energization OFF). The energization OFF time is, for example, about 2 to 15 sec.

Subsequently, the stirrer is reversely rotated (clockwise rotated) to stir the plating solution (stirring reverse rotation 1). At this time, a predetermined current is continuously allowed to flow between the anode electrode and the cathode electrode (energization ON). The rotation speed of the stirrer is, for example, about 90 rpm, and the energization ON time is, for example, about 20 to 60 sec. This continuous energization causes isotropic crystal growth of gold with reference to a new point on the electrodeposited gold layer formed through crystal growth during the stirring normal rotation 1, so that a new electrodeposited gold layer is formed.

Subsequently, the reverse rotation (clockwise rotation) of the stirrer is stopped to switch the stirring direction of the stirrer from the reverse rotation (clockwise rotation) to the normal rotation (counterclockwise rotation). At this time, no current is allowed to flow between the anode electrode and the cathode electrode (energization OFF). The energization OFF time is, for example, about 2 to 15 sec.

Subsequently, in the same way as the stirring normal rotation 1 and the stirring reverse rotation 1, stirring normal rotation 2 (energization ON), energization OFF, stirring reverse rotation 2 (energization ON), energization OFF, stirring normal rotation 3 (energization ON), energization OFF, and stirring reverse rotation 3 (energization ON) are sequentially performed. Consequently, there is formed an electrodeposited gold electrode comprised of six electrodeposited gold layers formed through crystal growth in the respective stirring steps of the stirring normal rotation 1, the stirring reverse rotation 1, the stirring normal rotation 2, the stirring reverse rotation 2, the stirring normal rotation 3, and the stirring reverse rotation 3.

While thickness of the electrodeposited gold layer formed in each stirring step depends on current density, energization time, temperature of the plating solution, supply flow rate of the plating solution, rotation speed of the stirrer, and the like, the thickness is, for example, about 0.5 μm, and thickness of the resultant electrodeposited gold electrode is, for example, about 3 μm.

In an existing electrolytic gold plating process, as illustrated in FIG. 9B, time for switching the stirring direction of the stirrer, i.e., the energization OFF time, during which no current is allowed to flow between the anode electrode and the cathode electrode, is, for example, about 1 sec. This is to prevent continuous crystal growth of gold from being interrupted. In this case, for example, as illustrated in FIG. 10B, crystal growth of gold proceeds isotropically, and an electrodeposited gold electrode APR comprised of gold crystal having a relatively large grain size is formed. During electrolytic plating, however, aging variation in composition of the plating solution occurs with increase in number of times of treatment or in lapse of time from initial make-up of electrolytic bath. Hence, a surface state of the electrodeposited gold electrode APR, which is formed through continuous crystal growth with the energization OFF time of 1 sec, tends to vary due to the aging variation in composition of the plating solution. In general, as the number of times of treatment or the lapse of time from initial make-up of electrolytic bath increases, the surface of the electrodeposited gold electrode APR gradually changes from a rough state to a smooth state.

On the other hand, in the electrolytic gold plating process using the first plating apparatus according to the first embodiment, time for switching the stirring direction of the stirrer, i.e., the energization OFF time, during which no current is allowed to flow between the anode electrode and the cathode electrode, is, for example, about 2 to 15 sec. In this case, for example, as illustrated in FIG. 10A, when energization is restarted in each stirring step, crystal growth of gold isotropically proceeds with reference to a new point, so that an electrodeposited gold layer comprised of gold crystal having a relatively small grain size is sequentially formed in each stirring step. For example, in comparison with the recipe configuration of FIG. 9A, a first electrodeposited gold layer P1 is formed in the stirring normal rotation 1, a second electrodeposited gold layer P2 is formed in the stirring reverse rotation 1, a third electrodeposited gold layer P3 is formed in the stirring normal rotation 2, a fourth electrodeposited gold layer P4 is formed in the stirring reverse rotation 2, a fifth electrodeposited gold layer P5 is formed in the stirring normal rotation 3, and a sixth electrodeposited gold layer P6 is formed in the stirring reverse rotation 3.

Consequently, the electrodeposited gold electrode AP having a rough surface with significant irregularities can be formed; hence, a surface state of the electrodeposited gold electrode AP is less affected by aging variation in composition of the plating solution, and thus the electrodeposited gold electrode AP is allowed to maintain its rough surface state.

If the energization OFF time, during which no current is allowed to flow between the anode electrode and the cathode electrode, is longer than 15 sec, plating process time is relatively long, leading to reduction in throughput of the plating process. If the energization OFF time is shorter than 2 sec, crystal growth of gold proceeds without interruption; hence, as illustrated in FIG. 10B, gold crystal having a relatively large grain size is grown. Consequently, it is considered that an appropriate range of the energization OFF time, during which no current is allowed to flow between the anode electrode and the cathode electrode, is, for example, 2 to 15 sec (it will be appreciated that the energization OFF time is not limited to such a range depending on other conditions). A range of the energization OFF time suitable for mass production is considered to be 3 to 11 sec, and besides a range having a central value between 5 and 7 sec is considered to be most preferred.

While the energization ON time, during which current is allowed to flow between the anode electrode and the cathode electrode, is set to be longer than the energization OFF time, if the energization ON time is too long, an electrodeposited gold layer comprised of gold crystal having a relatively large grain size is sequentially formed in each stirring step, and the electrodeposited gold electrode AP having a rough surface cannot be formed. Consequently, it is considered that an appropriate range of the energization ON time, during which current is allowed to flow between the anode electrode and the cathode electrode, is, for example, 20 to 60 sec (it will be appreciated that the energization ON time is not limited to such a range depending on other conditions).

FIG. 11 includes a graph showing surface roughness of the electrodeposited gold electrode with each of the energization ON time and the energization OFF time as a parameter, and a table collectively showing the energization ON time and the energization OFF time for each semiconductor wafer. The graph shows measurement results of surface roughness of the electrodeposited gold electrode, the roughness being measured at nine points in a plane of each semiconductor wafer.

As illustrated in FIG. 11, comparing between wafer Nos. #01 and Ref suggests that providing energization OFF time longer than 1 sec increases surface roughness of the electrodeposited gold electrode. Comparing between wafer Nos. #01, #02, and #03 suggests that shorter energization ON time increases surface roughness of the electrodeposited gold electrode. For example, while the average of surface roughness of wafer No. Ref 0.027 rad, the average of surface roughness of wafer No. #01 (energization ON time: 59 sec) is 0.032 rad, the average of surface roughness of wafer No. #02 (energization ON time: 29 sec) 0.033 rad, and the average of surface roughness of wafer No. #03 (energization ON time: 20 sec) 0.038 rad. In this way, plating is performed while the energization OFF time of about 2 to 15 sec is provided and the energization ON time is set short, thereby the electrodeposited gold electrode AP having a rough surface can be formed.

Although the first embodiment is described with six stirring steps, i.e., the stirring normal rotation 1, the stirring reverse rotation 1, the stirring normal rotation 2, the stirring reverse rotation 2, the stirring normal rotation 3, and the stirring reverse rotation 3, the number of stirring steps is not limited thereto. For example, the number of stirring steps is determined in consideration of thickness of the electrodeposited gold electrode AP, surface roughness of the electrodeposited gold electrode AP, parameters of plating (for example, current density, energization time, temperature of the plating solution, supply flow rate of the plating solution, and rotation speed of the stirrer), throughput of the plating process, and the like.

Although it is defined that stirring normal rotation is counterclockwise rotation and stirring reverse rotation is clockwise rotation in the first embodiment, the reverse is also acceptable, i.e., it may be defined that stirring normal rotation is clockwise rotation and stirring reverse rotation is counterclockwise rotation.

<Operation 5 of Electrolytic Plating Step>

As illustrated in FIG. 7A, after supply of the plating solution into the plating bath PT1 is stopped, the treatment cup TC1 is vertically turned 180 degrees so as to be into the erected state. As a result, the bottom of the treatment cup TC1 lies below, and the lid TO covering the plating bath PT1 lies above, and thus the device forming surface of the semiconductor wafer SW faces down.

<Operation 6 of Electrolytic Plating Step>

The plating solution is discharged from the inside of the plating bath PT1 through the liquid outlet PO. Since the treatment cup TC1 is in the erected state, the plating solution flows from the upper side of the plating bath PT1 to the lower side thereof, and is discharged from the bottom of the treatment cup TC1.

<Operation 7 of Electrolytic Plating Step>

The lid TO covering the opened face of the plating bath PT1 is opened to extract the semiconductor wafer SW from the treatment cup TC1.

4. Modification of Formation Method of Electrodeposited Gold Electrode by Electrolytic Gold Plating Process:

In the above-described 3. formation method of electrodeposited gold electrode by electrolytic gold plating process (<operation 4 of electrolytic plating step>), it is described that plating is performed while the energization OFF time of about 2 to 15 sec is provided and the energization ON time is set short, thereby the electrodeposited gold electrode having a rough surface can be formed. A modification of the method of forming the electrodeposited gold electrode having a rough surface is now described using Table 1. Table 1 summarily shows a relationship between energization ON time, current density, and surface roughness of the electrodeposited gold electrode.

TABLE 1

| | | CURRENT DENSITY | |
|---|---|---|---|
| | | LOW | HIGH |
| ENERGIZATION ON TIME | SHORT | HIGH SURFACE ROUGHNESS | MIDDLE SURFACE ROUGHNESS |
| | LONG | MIDDLE SURFACE ROUGHNESS | LOW SURFACE ROUGHNESS |

When the energization ON time in plating is short, gold crystal having a relatively small grain size is grown. When current density in plating is low, plating rate (crystal growth rate of gold) is slowed, making it possible to suppress grain growth of gold crystal. Hence, as shown in Table 1, plating is performed with short energization ON time and low current density, thereby the surface of the electrodeposited gold electrode can be roughened.

Furthermore, if plating is performed with short energization ON time and low current density while the energization OFF time of about 2 to 15 sec is provided, an electrodeposited gold electrode having a further rough surface can be formed.

<Formation Method of Electrodeposited Gold Electrode Using Second Plating Apparatus>

A formation method of an electrodeposited gold electrode (the electrodeposited gold electrode AP illustrated in FIG. 5) using a second plating apparatus according to the first embodiment is now described. The second plating apparatus has a treatment cup that is structured to stir a plating solution with a jet.

1. Internal Structure of Treatment Cup of Second Plating Apparatus:

An internal structure of the treatment cup of the second plating apparatus is described with FIG. 12. FIG. 12 is a major-part section diagram of the treatment cup of the second plating apparatus.

As illustrated in FIG. 12, the treatment cup TC2 of the second plating apparatus has a bottom and a sidewall, and a plating bath PT2 exists in the inside of the treatment cup TC2. The plating bath PT2 has a bottom BO2 and a side face, and is opened on its side opposed to the bottom BO2. The semiconductor wafer SW is set on the upper side of the plating bath PT2 while a device forming surface is allowed to face the inside of the plating bath PT2.

An anode electrode AE2 is provided on a bottom BO2 side of the plating bath PT2. The anode electrode AE2 is an indium oxide electrode or a platinum electrode, for example. A cathode electrode CE for electrical coupling to the semiconductor wafer SW is provided in the upper side of the side face of the plating bath PT2. A liquid inlet PI2 for introducing a plating solution is provided in the center of the bottom B02 of the plating bath PT2. The plating solution supplied through the liquid inlet PI2 vigorously flows within the plating bath PT2, and is discharged from the upper side of the plating bath PT2.

The second plating apparatus is not vertically turned over unlike the first plating apparatus. Hence, the device forming surface of the semiconductor wafer SW usually (in each of the cases where the semiconductor wafer SW is set in the treatment cup, where the semiconductor wafer SW is extracted from the treatment cup, and where the semiconductor wafer SW is subjected to plating) faces down (facedown).

Figure 13A:
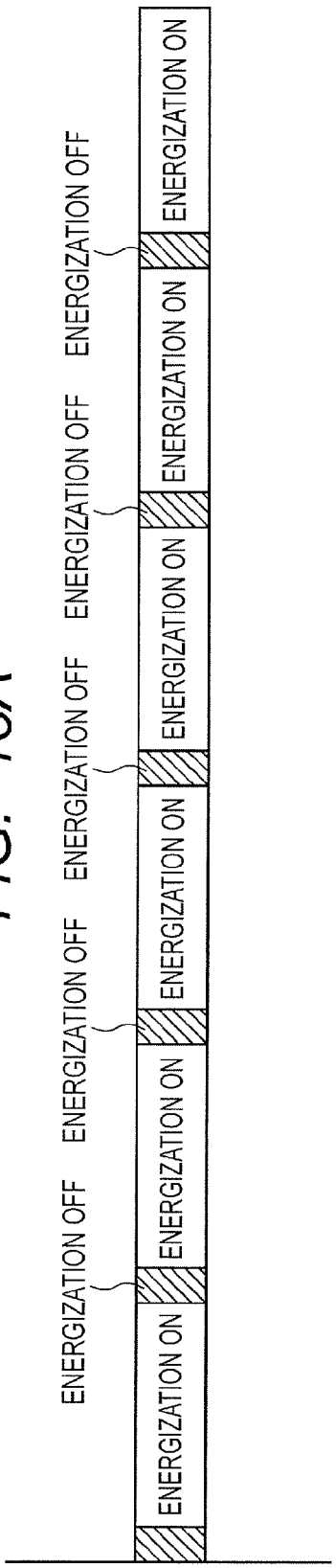
FIG. 13A is a schematic illustration of a recipe configuration in plating using the second plating apparatus according to this embodiment.
Figure 13B:
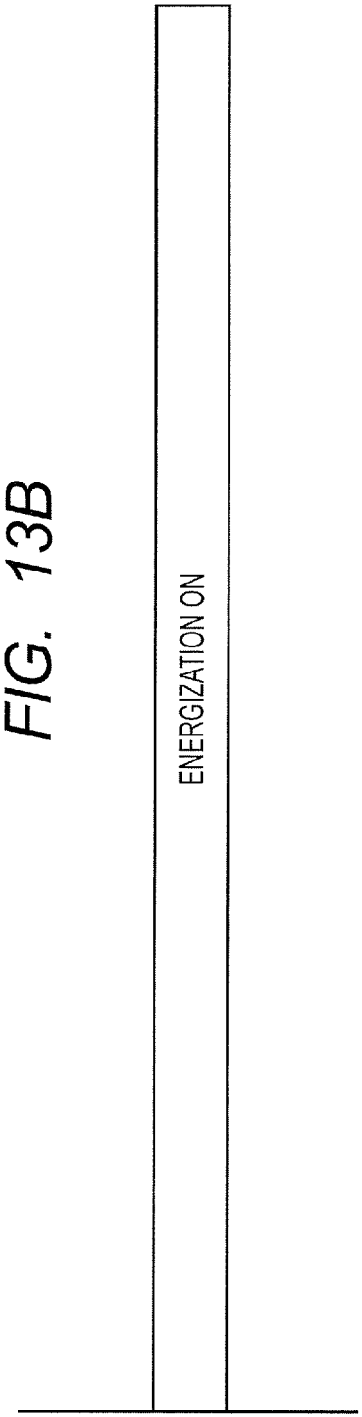
FIG. 13B is a schematic illustration of a recipe configuration in plating using the second plating apparatus in a comparative investigation by the inventors.

2. Formation Method of Electrodeposited Gold Electrode by Electrolytic Gold Plating Process:

A formation method of the electrodeposited gold electrode by the electrolytic gold plating process (an electrolytic plating step (step S4 of FIG. 8)) is now described with FIGS. 10A and 10B, FIG. 12, and FIGS. 13A and 13B. FIG. 13A is a schematic illustration of a recipe configuration in plating using the second plating apparatus. FIG. 13B is a schematic illustration of a recipe configuration in plating using the second plating apparatus in a comparative investigation by the inventors.

<Operation 1 of Electrolytic Plating Step>

As illustrated in FIG. 12, the semiconductor wafer SW washed with pure water is transferred into the plating bath PT2 of the treatment cup TC2, and the semiconductor wafer SW is set on the upper side of the plating bath PT2 while the device forming surface is allowed to face the inside of the plating bath PT2. In addition, the opened face of the plating bath PT2 is covered by the semiconductor wafer SW. The periphery of the device forming surface of the semiconductor wafer SW comes into contact with the cathode electrode CE.

<Operation 2 of Electrolytic Plating Step>

As illustrated in FIG. 12, the plating solution is supplied through the liquid inlet PI2 provided in the bottom of the treatment cup TC2, and the plating solution in the plating bath PT2 is stirred with a jet. The plating solution is a non-cyanide plating solution, and is, for example, a gold sulfite plating solution (including, as a main component, an aqueous solution of sodium gold sulfite, ethylene diamine, inorganic acid salts, and other trace additives). In this operation, energization for electrolytic plating is not performed, i.e., no current is allowed to flow between the anode electrode AE2 and the cathode electrode CE.

<Operation 3 of Electrolytic Plating Step>

As illustrated in FIG. 13A, a predetermined current is allowed to flow between the anode electrode and the cathode electrode for a predetermined time (energization ON). The energization ON time is, for example, about 20 to 60 sec.

This continuous energization allows isotropic crystal growth of gold on the seed film, resulting in formation of a first electrodeposited gold layer.

Subsequently, the energization between the anode electrode and the cathode electrode is suspended (energization OFF) to suspend crystal growth of gold. The energization OFF time is, for example, about 2 to 15 sec.

Subsequently, a predetermined current is allowed to flow again between the anode electrode and the cathode electrode for a predetermined time (energization ON). The energization ON time is, for example, about 20 to 60 sec. During this operation, crystal growth of gold isotropically proceeds with reference to a new point on the previously formed, first electrodeposited gold layer, and a second electrodeposited gold layer is formed.

Subsequently, the energization between the anode electrode and the cathode electrode is suspended (energization OFF) to suspend crystal growth of gold. The energization OFF time is, for example, about 2 to 15 sec.

Subsequently, the energization ON and the energization OFF are alternately repeated, thereby an electrodeposited gold electrode AP comprised of a plurality of electrodeposited gold layers in the stack is formed as illustrated in FIG. 10A.

As illustrated in FIG. 13B, when energization OFF time is not provided to prevent continuous crystal growth of gold from being interrupted, for example, as illustrated in FIG. 10B, an electrodeposited gold electrode APR comprised of gold crystal having a relatively large grain size is formed. As described above, during electrolytic plating, aging variation in composition of the plating solution occurs with increase in number of times of treatment or in lapse of time from initial make-up of electrolytic bath. Hence, a surface state of the electrodeposited gold electrode APR formed through crystal growth without providing the energization OFF time tends to vary due to the aging variation in composition of the plating solution. In general, as the number of times of treatment or the lapse of time from initial make-up of electrolytic bath increases, the surface of the electrodeposited gold electrode APR gradually changes from a rough state to a smooth state.

On the other hand, in the electrolytic gold plating process using the second plating apparatus according to the first embodiment, for example, as illustrated in FIG. 10A, an electrodeposited gold electrode AP is configured of stacked electrodeposited gold layers each being comprised of gold crystal having a relatively small grain size. Consequently, the electrodeposited gold electrode AP having a rough surface with significant irregularities can be formed; hence, the surface state of the electrodeposited gold electrode AP is less affected by aging variation in composition of the plating solution, and thus the electrodeposited gold electrode AP is allowed to maintain its rough surface state.

It is considered that an appropriate range of the energization OFF time, during which no current is allowed to flow between the anode electrode and the cathode electrode, is, for example, 2 to 15 sec (it will be appreciated that the energization OFF time is not limited to such a range depending on other conditions) as with the first plating apparatus. A range of the energization OFF time suitable for mass production is considered to be 3 to 11 sec, and besides a range having a central value between 5 and 7 sec is considered to be most preferred.

It is considered that an appropriate range of the energization ON time, during which current is allowed to flow between the anode electrode and the cathode electrode, is, for example, 20 to 60 sec (it will be appreciated that the energization ON time is not limited to such a range depending on other conditions) as with the first plating apparatus.

Although the energization ON time is divided in six in the first embodiment, this is not limitative. For example, the number of times of the energization ON time is determined in consideration of thickness of the electrodeposited gold electrode AP, surface roughness of the electrodeposited gold electrode, parameters of plating (for example, current density, energization time, temperature of the plating solution, supply flow rate of the plating solution, and rotation speed of the stirrer), throughput of the plating process, and the like.

<Operation 4 of Electrolytic Plating Step>

After supply of the plating solution into the plating bath PT2 is stopped, the semiconductor wafer SW is extracted from the treatment cup TC2 (see FIG. 12).

<Effects of First Embodiment>

In this way, according to the first embodiment, even if aging variation in composition of the plating solution occurs with increase in number of times of treatment or lapse of time from initial make-up of electrolytic bath during electrolytic plating, variation in surface state of the electrodeposited gold electrode AP is suppressed, and a surface state with a surface roughness of, for example, 0.025 rad or more can be maintained. Consequently, even if gold precipitation (which is not necessary to be determined to be anomalous in appearance inspection) occurs in a step of forming an electrodeposited gold electrode, the electrodeposited gold electrode can be determined to be normal in appearance while such gold precipitation is not recognized in appearance inspection; hence, false reports on appearance inspection of a semiconductor device can be decreased.

Although the invention achieved by the inventors has been described in detail according to an embodiment hereinbefore, the invention should not be limited thereto, and it will be appreciated that various modifications or alterations thereof may be made within the scope without departing from the spirit of the invention.

For example, although the above-described embodiment has been described with formation of an electrodeposited gold electrode, it will be appreciated that the invention can also be applied to formation of an electrodeposited copper electrode or an electrodeposited nickel electrode.

Moreover, although the above-described embodiment has been described with an electrodeposited gold electrode having an OPM structure, which is to be electrically coupled to a pad electrode, it will be appreciated that the invention can also be applied to formation of a gold bump electrode.

What is claimed is:

1. A method of manufacturing a semiconductor device, comprising the step of:
   (a) forming an electrodeposited electrode over a main surface of a semiconductor wafer provided in a plating solution bath with an anode electrode in a treatment cup,
   wherein (a) includes the steps of:
      (a1) performing energization where current continuously flows for at least 20 sec. between the anode electrode and the semiconductor wafer to cause crystal growth of an electrodeposited gold layer over the main surface of the semiconductor wafer, and
      (a2) performing non-energization where the current does not flow for at least 2 sec. between the anode electrode and the semiconductor wafer, and
   wherein the step (a1) and the step (a2) are alternately repeated a plurality of times, and the electrodeposited electrode is formed by repeating the step (a1) directly followed by the step (a2) to form a stack of electrodeposited gold layers which comprise the electrodeposited electrode, and wherein each of the electrodeposited gold layers is 0.5 μm thick.

2. The method according to claim 1, wherein a non-energization time in the step (a2) is 2 to 15 sec.

3. The method according to claim 1, wherein a non-energization time in the step (a2) is 3 to 11 sec.

4. The method according to claim 1,
wherein a non-energization time in the step (a2) is 5 to 7 sec.

5. The method according to claim 1,
wherein an energization time in the step (a1) is longer than a non-energization time in the step (a2).

6. The method according to claim 1,
wherein an energization time in the step (a1) is 20 to 60 sec.

7. The method according to claim 1,
wherein the electrodeposited electrode includes one of gold, copper, and nickel as a main component.

8. The method according to claim 1, further comprising the steps of:
before the step (a),
(b) forming a pad electrode over the main surface of the semiconductor wafer;
(c) after the step (b), forming an insulating film over the main surface of the semiconductor wafer so as to cover the pad electrode;
(d) after the step (c), forming an opening in the insulating film to expose a top of the pad electrode, and
(e) after the step (d), forming a seed film over the main surface of the semiconductor wafer,
wherein the electrodeposited electrode is formed over the seed film.

9. The method according to claim 8,
wherein the pad electrode comprises an aluminum film, and the seed film comprises a stacked film including a titanium film and a palladium film formed in order.

10. The method according to claim 1, wherein the plating solution is stirred by a stirrer in the step (a1), and
wherein a direction of stirring by the stirrer is reversed when repeating the step (a1).

11. A method of manufacturing a semiconductor device, comprising:
(a) forming an electrodeposited gold electrode over a main surface of a semiconductor wafer provided in a gold sulfite plating solution bath with a non-gold anode electrode in a treatment cup,
wherein (a) includes the steps of:
(a1) performing energization where current continuously flows for at least 20 sec. between the anode electrode and the semiconductor wafer to cause crystal growth of an electrodeposited gold layer over the main surface of the semiconductor wafer, and
(a2) performing non-energization where the current does not flow for at least 2 sec. between the anode electrode and the semiconductor wafer, and
wherein the step (a1) and the step (a2) are alternately repeated, and the electrodeposited electrode is formed by repeating the step (a1) directly followed by the step (a2) to form a stack of electrodeposited gold layers which comprise the electrodeposited electrode,
wherein each of the electrodeposited layers is 0.5 μm thick, and the electrodeposited electrode is 3 μm thick, and
wherein a direction of stirring the gold sulfite plating solution bath is alternately reversed when repeating the step (a1).

12. The method according to claim 1, wherein the electrodeposited electrode has a surface roughness of 0.025 rad or more.

13. The method according to claim 11, wherein the electrodeposited electrode has a surface roughness of 0.025 rad or more.

* * * * *